(12) United States Patent
Chen

(10) Patent No.: US 8,514,577 B2
(45) Date of Patent: Aug. 20, 2013

(54) VIDEO SERVER SET

(75) Inventor: Min-Wei Chen, Taipei (TW)

(73) Assignee: Vivotek Inc., New Taipei (TW)

( * ) Notice: Subject to any disclaimer, the term of this patent is extended or adjusted under 35 U.S.C. 154(b) by 334 days.

(21) Appl. No.: 13/027,524

(22) Filed: Feb. 15, 2011

(65) Prior Publication Data

US 2012/0206876 A1     Aug. 16, 2012

(51) Int. Cl.
*H02B 1/01* (2006.01)
*H05K 5/00* (2006.01)
*H05K 7/16* (2006.01)

(52) U.S. Cl.
USPC ............ 361/727; 361/724; 361/825; 248/906

(58) Field of Classification Search
USPC ............... 361/679.02, 679.58, 724–727, 825; 248/291.1, 299.1, 300, 906
See application file for complete search history.

(56) References Cited

U.S. PATENT DOCUMENTS

| | | | | | |
|---|---|---|---|---|---|
| 1,076,116 | A | * | 10/1913 | Hatfield | 312/111 |
| 2,956,705 | A | * | 10/1960 | Clingman | 220/683 |
| 3,093,568 | A | * | 6/1963 | Cox | 376/459 |
| 3,265,935 | A | * | 8/1966 | Rosa | 361/796 |
| 3,661,434 | A | * | 5/1972 | Alster | 312/111 |
| 3,751,127 | A | * | 8/1973 | Black et al. | 312/111 |
| 3,841,726 | A | * | 10/1974 | Andros et al. | 312/111 |
| 4,005,559 | A | * | 2/1977 | Mathou | 52/282.4 |
| 4,321,654 | A | * | 3/1982 | Nakajo et al. | 361/744 |
| 4,676,038 | A | * | 6/1987 | Doyon et al. | 52/282.2 |
| 5,666,713 | A | * | 9/1997 | Kubota | 29/525.01 |
| 5,813,791 | A | * | 9/1998 | Kubota | 403/294 |
| 5,826,955 | A | * | 10/1998 | Sanders et al. | 312/111 |
| 6,250,843 | B1 | * | 6/2001 | Olson et al. | 403/381 |
| 6,359,788 | B1 | * | 3/2002 | Giese et al. | 361/756 |
| 6,469,901 | B1 | * | 10/2002 | Costner | 361/730 |
| 6,751,096 | B2 | * | 6/2004 | Aldon | 361/695 |
| D560,217 | S | * | 1/2008 | Adachi et al. | D14/300 |
| 7,922,417 | B2 | * | 4/2011 | Jimenez | 403/364 |
| 8,289,696 | B2 | * | 10/2012 | Peng et al. | 361/679.39 |
| 8,376,166 | B2 | * | 2/2013 | Kindig et al. | 220/4.02 |
| 2005/0058891 | A1 | * | 3/2005 | Marraffa | 429/99 |
| 2006/0180555 | A1 | * | 8/2006 | Shih et al. | 211/26 |
| 2006/0180556 | A1 | * | 8/2006 | Shih et al. | 211/26 |
| 2009/0040692 | A1 | * | 2/2009 | Barringer et al. | 361/679 |
| 2011/0043986 | A1 | * | 2/2011 | Conn et al. | 361/679.02 |
| 2012/0008285 | A1 | * | 1/2012 | Renkel et al. | 361/724 |

FOREIGN PATENT DOCUMENTS

| | | |
|---|---|---|
| TW | I265766 | 11/2006 |
| TW | I265771 | 11/2006 |

\* cited by examiner

*Primary Examiner* — Adrian S Wilson
(74) *Attorney, Agent, or Firm* — Morris Manning & Martin LLP; Tim Tingkang Xia, Esq.

(57) ABSTRACT

A server set includes a first video server, a second video server and a joint member. A first surface of the first video server has a first fastening groove, and the first fastening groove has a first chute portion and a first intermediate portion. The second video server has a second surface, in which the second surface has a second fastening groove, and the second fastening groove has a second chute portion and a second intermediate portion. A main body portion of the joint member corresponds to and is accommodated in the first intermediate portion and the second intermediate portion. A first hook portion and a second hook portion are accommodated in and hooked with the first chute portion and the second chute portion respectively, so that the first video server is connected with the second video server through the joint member.

9 Claims, 8 Drawing Sheets

VIDEO SERVER SET

BACKGROUND OF THE INVENTION

1. Field of the Invention

The present invention relates to a video server set, and more particularly to a video server set in which two video servers are connected through a joint member, and a video server set in which a video server and a support plate are connected through a fixing member.

2. Related Art

In the past, to enjoy audio/video resources, the audio/video resources in a physical optical disk need to be played with a player, or a video file in a computer needs to be run. However, due to the rapid development of network technologies, various audio/video files and services provided by a video server can be enjoyed by connection to the video server through a network. Compared with an ordinary text file or graphics file, the audio/video file occupies more storage spaces, so that the audio/video file provider usually integrates multiple video servers to provide users with more audio/video options or more convenient services.

Conventionally, in the industry, a multicellular rack housing is generally used, and all the video servers are configured one by one in an accommodation frame of the rack housing to save the space. In order to fix each video server to the accommodation frame, lots of fixing members are needed. However, such a manner of fixing the video servers one by one is rather troublesome, and even a problem that the video server cannot be secured onto the rack housing only due to the loss of one of the fixing members may occur.

Therefore, a rackmount technology in which a plurality of video servers is connected in series and then fixed to the rack housing as a whole is developed. However, although it is easier to secure a single video server to the rack housing for use, the plurality of video servers connected in series is difficult to be regularly fixed on the rack housing.

For example, both ROC Patent No. I265771 and ROC Patent No. I265766 respectively disclose a cabinet rack fixing structure, in which a plurality of electronic devices is secured at the same side with a plurality of fixing members. However, such a method also requires a plurality of securing elements to perform the joint just like the conventional structure of fixing the video servers one by one. Moreover, the jointing area is quite small, so the connection between the video servers is not stable, and it is easy to cause irregularity of the joint or even disconnection due to accidental events such as external impact.

SUMMARY OF THE INVENTION

In order to solve the above problem, a video server set is provided. The video server set comprises a first video server, a second video server and a joint member. A first surface of the first video server has a first fastening groove, and the first fastening groove has a first chute portion and a first intermediate portion. The second video server has a second surface opposite to the first surface, in which the second surface has a second fastening groove, and the second fastening groove has a second chute portion and a second intermediate portion. The joint member has a main body portion, a first hook portion and a second hook portion. The main body portion corresponds to and is accommodated in the first intermediate portion and the second intermediate portion, the first hook portion is accommodated in and is hooked with the first chute portion, and the second hook portion is accommodated in and is hooked with the second chute portion.

The main body portion may have two opposite side surfaces, and the two side surfaces face the first video server and the second video server respectively. The first hook portion is configured at one of the two side surfaces of the main body portion, and the second hook portion is configured at the other of the two side surfaces of the main body portion.

According to an embodiment, the first hook portion and the second hook portion may be configured at end edges of the main body portion.

In order to enable the joint member to more stably connect the first video server and the second video server, the first fastening groove may further have a third chute portion, the second fastening groove may further have a fourth chute portion, and the video server set may further comprise a third hook portion and a fourth hook portion. The third hook portion is configured at the same side of the main body portion together with the first hook portion, and is accommodated in the third chute portion; while the fourth hook portion is configured at the same side of the main body portion together with the second hook portion, and is accommodated in the fourth chute portion. The first hook portion and the second hook portion are configured at one end edge of the two side surfaces, and the third hook portion and the fourth hook portion are configured at the other end edge of the two side surfaces.

According to an embodiment, the first video server may further have a third surface adjacent to the first surface, and the first fastening groove forms a first port on the third surface. The second video server may further have a fourth surface adjacent to the second surface, and the second fastening groove forms a second port on the fourth surface. Furthermore, the video server set may further comprise a baffle plate, in which two ends of the baffle plate are connected with a locking portion on the third surface and a locking portion on the fourth surface respectively, and the baffle plate shields a part of the first port and the second port.

The present invention also provides another video server set, which comprises a third video server and a fixing member. The third video server may be the first video server or the second video server as described above. A fifth surface of the third video server has a third fastening groove, and the third fastening groove has a fifth chute portion and a third intermediate portion. The fixing member has a main body portion, a fifth hook portion and a support portion, in which the main body portion corresponds to and is accommodated in the third intermediate portion, and the fifth hook portion is accommodated in the fifth chute portion. The support portion is connected with the main body portion, and leans against and is connected with a support plate, so that the fixing member is connected with the support plate.

The main body portion may have two opposite side surfaces, in which one of the side surfaces faces the fifth surface, and the fifth hook portion is configured at the side surface of the main body portion facing the fifth surface.

In order to enable the fixing member to be more stably connected with the third video server and the support plate, the third fastening groove of the third video server may further have a sixth chute, and the fixing member may further comprise a sixth hook portion. The sixth hook portion and the fifth hook portion are configured at two corresponding ends of the same side of the main body portion, and the sixth hook portion is accommodated in a sixth chute portion.

According to an embodiment, the fifth hook portion or the sixth hook portion may be configured at an end edge of the main body portion.

In view of the above, the plurality of video servers, the joint member and the fixing member in the video server set are stably connected with each other by using the chute portions and the hook portions, and are fixed on the support plate of the rack housing. By disposing the chutes and the hooks of the joint member, the volume occupied by the video server set can be saved, and the problems of the complex joint manner and the unstable connection in the prior art can be alleviated.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The detailed features and advantages of the present invention are described below in great detail through the following embodiments, the content of the detailed description is sufficient for those skilled in the art to understand the technical content of the present invention and to implement the present invention there accordingly. Based upon the content of the specification, the claims, and the drawings, those skilled in the art can easily understand the relevant objectives and advantages of the present invention.

The present invention provides a video server set, in which at least two video servers are connected with each other in series, and then fixed to a rack housing as a rackmount.

Figure 1:
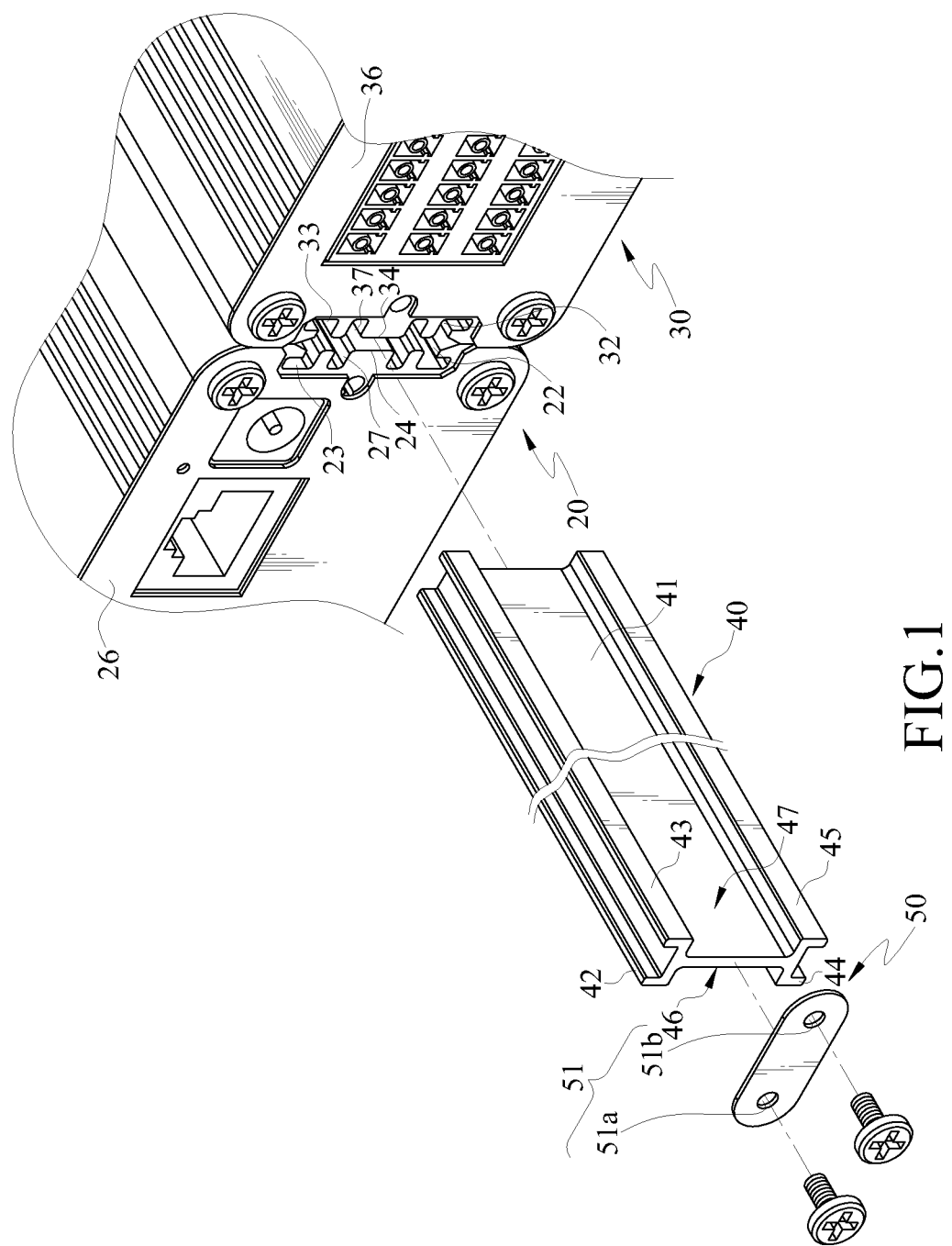
FIG. 1 is an exploded view of a video server set according to an embodiment.
Figure 2:
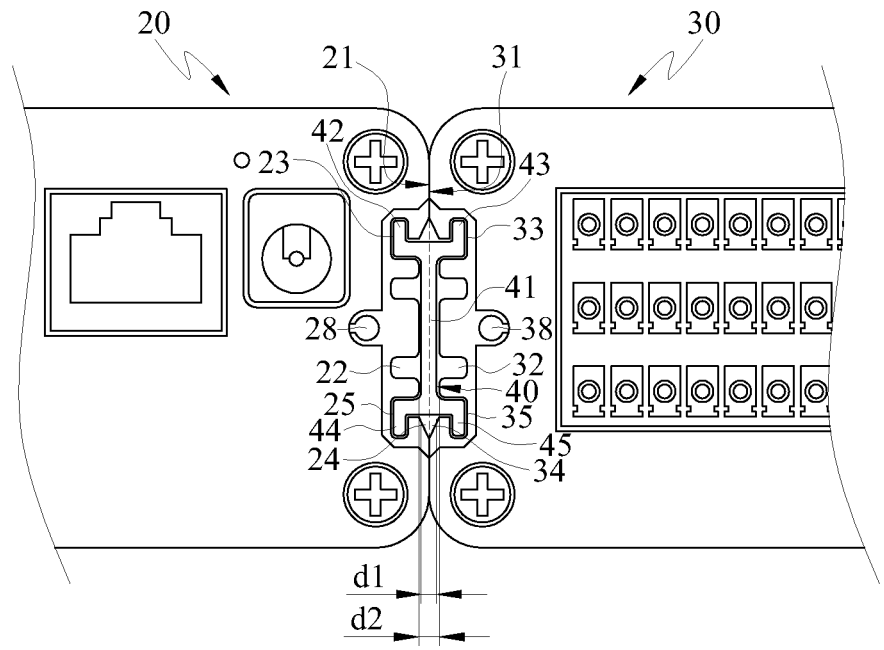
FIG. 2 is a back view of a video server set according to an embodiment.
Figure 3:
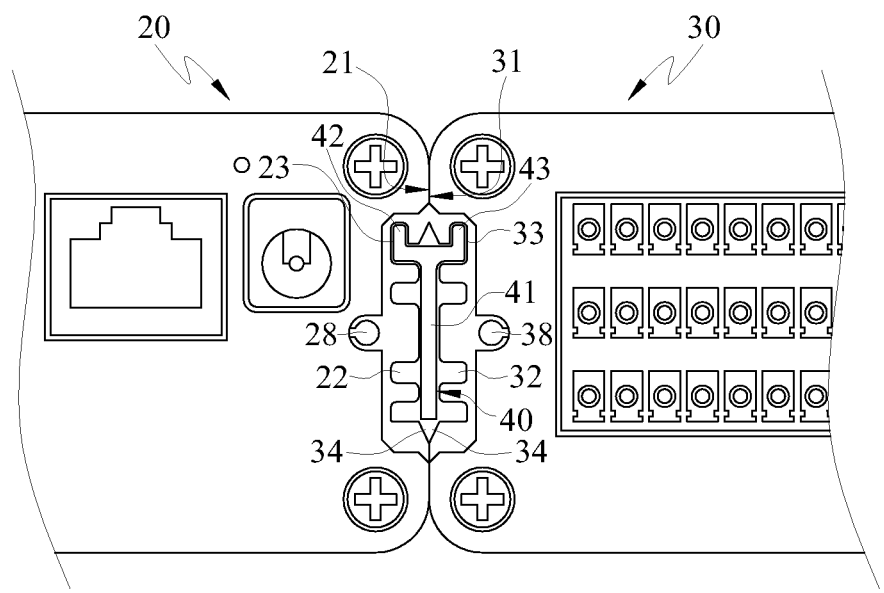
FIG. 3 is a back view of a video server set according to an embodiment.

FIGS. 1, 2 and 3 are an exploded view of the video server set according to an embodiment and back views according to different embodiments respectively.

The video server set comprises a first video server 20, a second video server 30 and a joint member 40. The first video server 20 and the second video server 30 are configured adjacently, and respectively have a first surface 21 and a second surface 31 opposite to each other. A first fastening groove 22 is disposed on the first surface 21, and the first fastening groove 22 has a first chute portion 23 and a first intermediate portion 24. The second surface 31 has a second fastening groove 32, and the second fastening groove 32 has a second chute portion 33 and a second intermediate portion 34. Therefore, when the first surface 21 contacts the second surface 31 correspondingly, a space for the first fastening groove 22 and the second fastening groove 32 is left.

The joint member 40 has a main body portion 41, a first hook portion 42 and a second hook portion 43. The main body portion 41 may be in a plate shape, and has two opposite side surfaces 46 and 47; the side surface 46 and the side surface 47 respectively face the first video server 20 and the second video server 30. The first hook portion 42 is configured at one of the two side surfaces of the main body portion 41, for example, the side surface 46; while the second hook portion 43 is configured at the other of the two side surfaces of the main body portion 41, for example, the side surface 47. A distance d1 between the closest two surfaces of the first intermediate portion 24 and the second intermediate portion 34 is slightly larger than a thickness d2 of the main body portion 41, so that the main body portion 41 corresponds to and is accommodated in the first intermediate portion 24 and the second intermediate portion 34. Similarly, the first hook portion 42 is accommodated in and is hooked with the first chute portion 23, while the second hook portion 43 is accommodated in and is hooked with the second chute portion 33.

The first chute portion 23 and the first hook portion 42 match in shape, while the second chute portion 33 and the second hook portion 43 match in shape. Therefore, the entire joint member 40 can be just completely accommodated in the space for the first fastening groove 22 and the second fastening groove 32, and the first hook portion 42 and the second hook portion 43 can tightly buckle the first video server 20 and the second video server 30.

The joint member 40 may only have the first hook portion 42 and the second hook portion 43, as shown in FIG. 3. However, according to an embodiment, in order to further stabilize the connection between the video servers, the joint member 40 may further have a third hook portion 44 and a fourth hook portion 45, as shown in FIGS. 1 and 2. Furthermore, to match with the joint member 40, the first fastening groove 22 may further have a third chute portion 25, and the second fastening groove 32 may further have a fourth chute portion 35. The third hook portion 44 is accommodated in the third chute portion 25, and is configured at the same side (for example, on the side surface 46) of the main body portion 41 together with the first hook portion 42. The fourth hook portion 45 is accommodated in the fourth chute portion 35, and is configured at the same side (for example, on the side surface 47) of the main body portion 41 together with the second hook portion 43. The first hook portion 42 and the second hook portion 43 may be configured at one end edge of the two side surfaces, and the third hook portion 44 and the fourth hook portion 45 may be configured at the other end edge of the two side surfaces.

In this manner, the front and rear ends of the first video server 20 are both hooked with the joint member 40, and a displacement relative to the second video server 30 is not easily generated. Therefore, no matter in which direction a force is applied to the video server set, it is ensured that the first surface 21 contacts the second surface 31, and the video server set is enabled to maintain the regular connection.

The first video server 20 may further have a third surface 26 adjacent to the first surface 21, and the first fastening groove 22 forms a first port 27 on the third surface 26. Likewise, the second video server 30 further has a fourth surface 36 adjacent to the second surface 31, and the second fastening groove 32 forms a second port 37 on the fourth surface 36. The third surface 26 and the fourth surface 36 may be rear surfaces of the first video server 20 and the second video server 30 respectively.

The joint member 40 may slide into the space formed by the first fastening groove 22 and the second fastening groove 32 from the first port 27 and the second port 37, and sequentially engage the first video server 20, the joint member 40 and the second video server 30 through the first hook portion 42 and the second hook portion 43. Furthermore, it can be known in FIG. 1 that, the joint member 40 has a certain length to increase the contact area between the joint member 40 and the first video server 20 as well as the second video server 30. In this manner, the connection between the first video server 20 and the second video server 30 becomes more stable. According to an embodiment, the material of the joint member 40 may be metal or alloy, which ensures the strength of the joint member 40, thereby preventing the joint member 40 from being deformed or broken due to accidental events such as external impact.

Preferably, the joint member 40 is made of metal or other rigid materials, and the length thereof is not larger than the length from the front surface to the rear surface of the video server. Furthermore, the height of the joint member 40 is not larger than the height of the video server either, so that the joint member 40 can be completely accommodated in the first fastening groove 22 and the second fastening groove 32.

Figure 4:
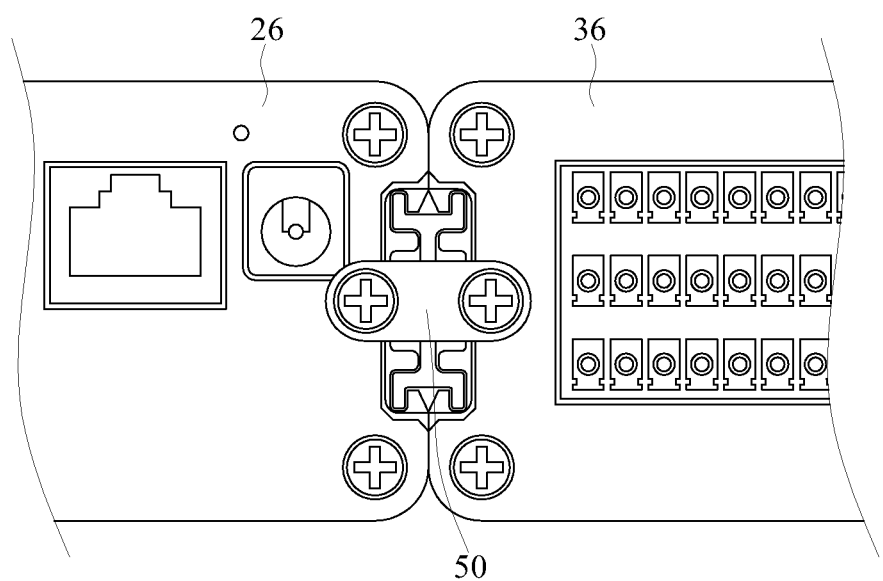
FIG. 4 is a back view of a video server set according to an embodiment.

The following content is illustrated with reference to FIG. 4 in combination with FIGS. 1 and 2.

According to an embodiment, the video server set may further comprise a baffle plate 50, to prevent the joint member 40 from sliding out of the first port 27 and the second port 37 due to such reasons as that the first video server 20 or the second video server 30 is moved. Locking portions 28 and 38 are disposed on the third surface 26 and the fourth surface 36 respectively. Two corresponding locking holes 51 (51a and 51b) are respectively configured at two ends of the baffle plate 50, and are respectively connected with the locking portions 28 and 38. When the baffle plate 50 is fixed on the third surface 26 and the fourth surface 36, the baffle plate 50 shields a part of the first port 27 and the second port 37. The baffle plate 50 may be in a transverse plate shape.

Figure 5:
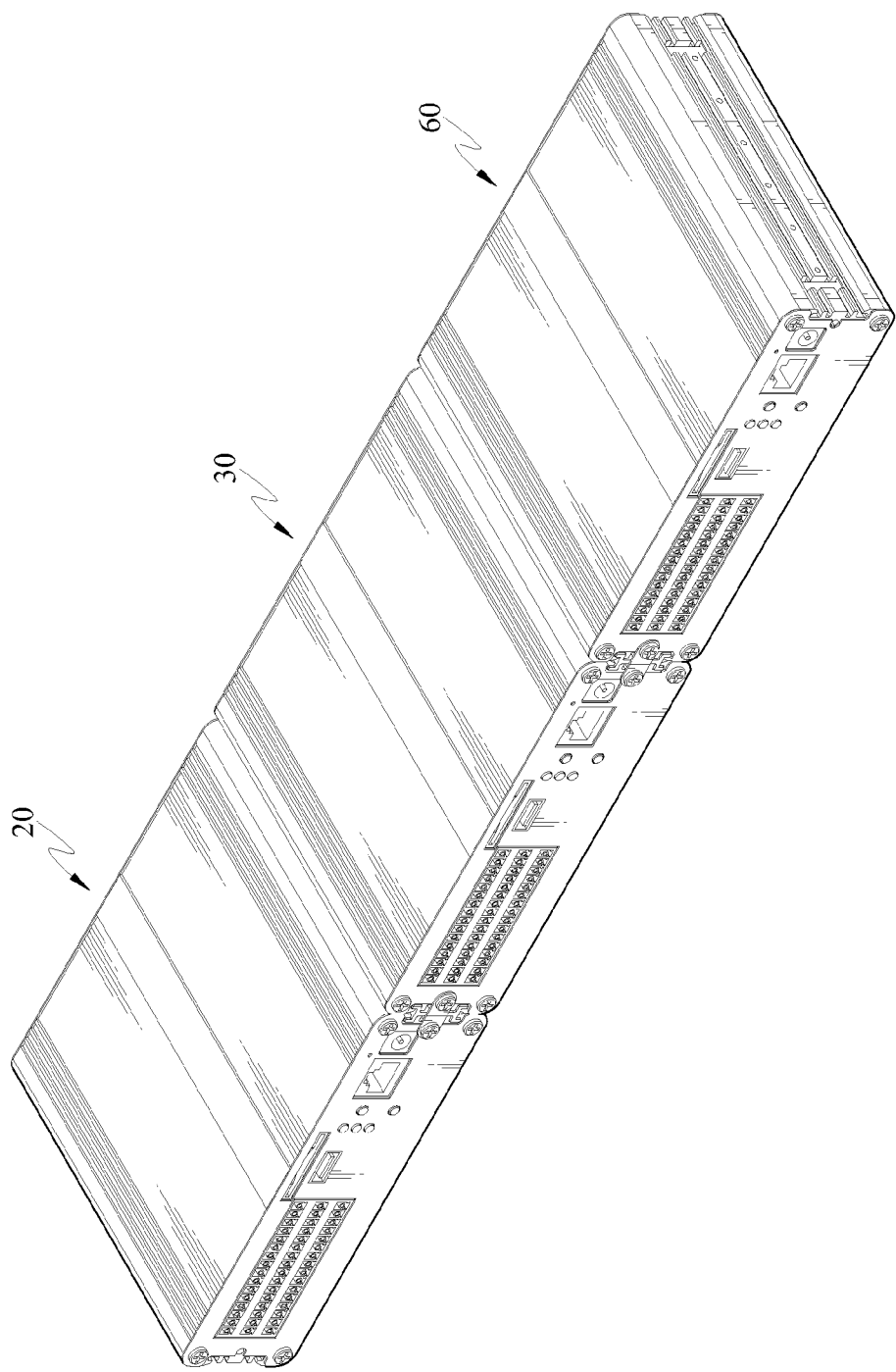
FIG. 5 is an outside view of a video server set according to an embodiment.

The video server set configured and assembled with the joint member 40 and the baffle plate 50 may be as shown in FIG. 5. Besides the first video server 20 and the second video server 30, the video server set may also comprise other video servers, for example, a third video server 60. Joint members 40 are engaged between the first video server 20 and the second video server 30, and engaged between the second video server 30 and the third video server 60 respectively, so that the entire video server set is regularly connected in series.

Figure 6:
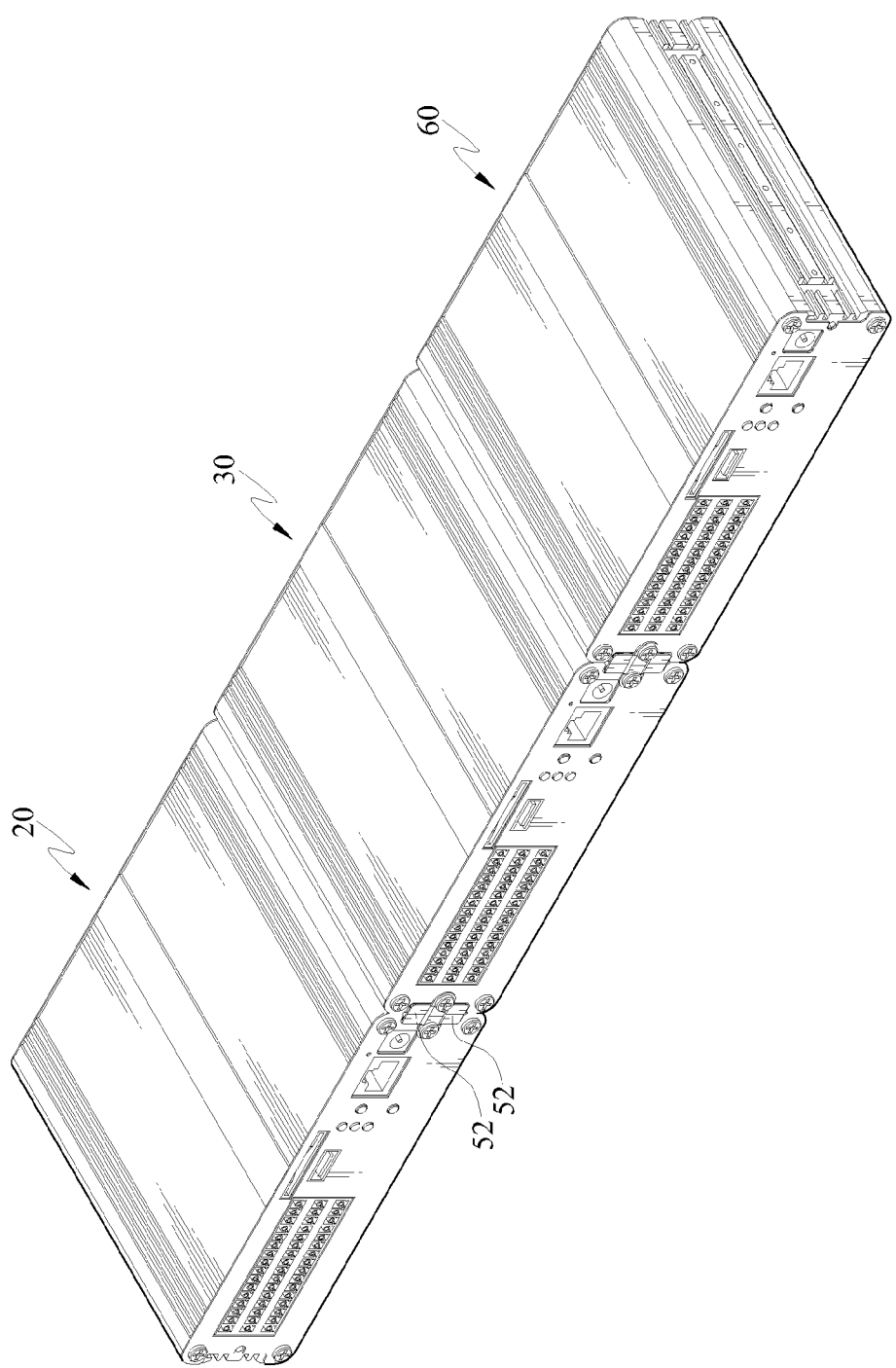
FIG. 6 is an outside view of a video server set according to an embodiment.

According to an embodiment, besides the main body in the transverse plate shape, the baffle plate 50 may also have upper and lower fins 52 as shown in FIG. 6, so as to more reliably seal the first port 27 and the second port 37.

Figure 7:
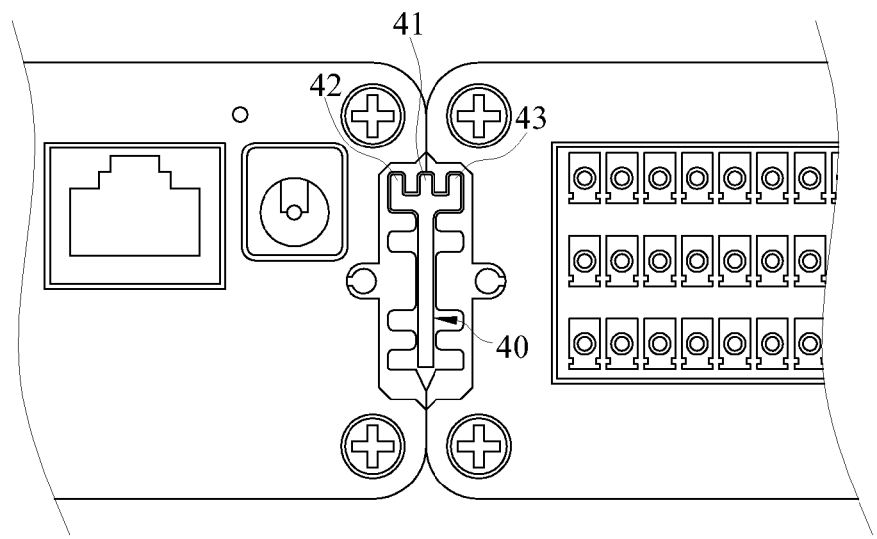
FIG. 7 is a back view of a video server set according to an embodiment.
Figure 8:
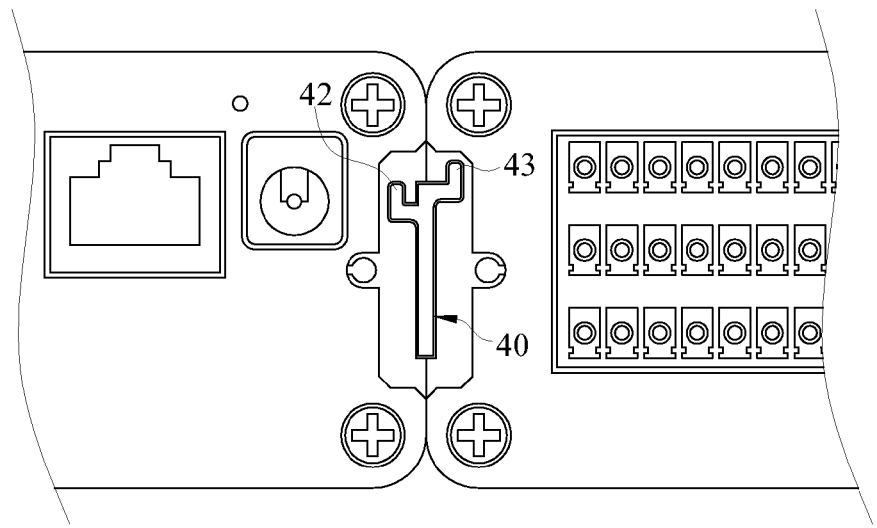
FIG. 8 is a back view of a video server set according to an embodiment.

Furthermore, the first hook portion 42 and the second hook portion 43 may be configured at end edges of the two side surfaces of the main body portion 41, as shown in FIG. 3. However, the first hook portion 42 and the second hook portion 43 may be symmetrically or asymmetrically disposed with each other. The first hook portion 42 and the second hook portion 43 may be configured at a distance away from an end edge of the main body portion 41, as shown in FIGS. 7 and 8.

The present invention further provides the video server set, which comprises the third video server 60 and a fixing member. The fixing member is used for fixing the entire video server set on a support plate of a rack housing.

Figure 9:
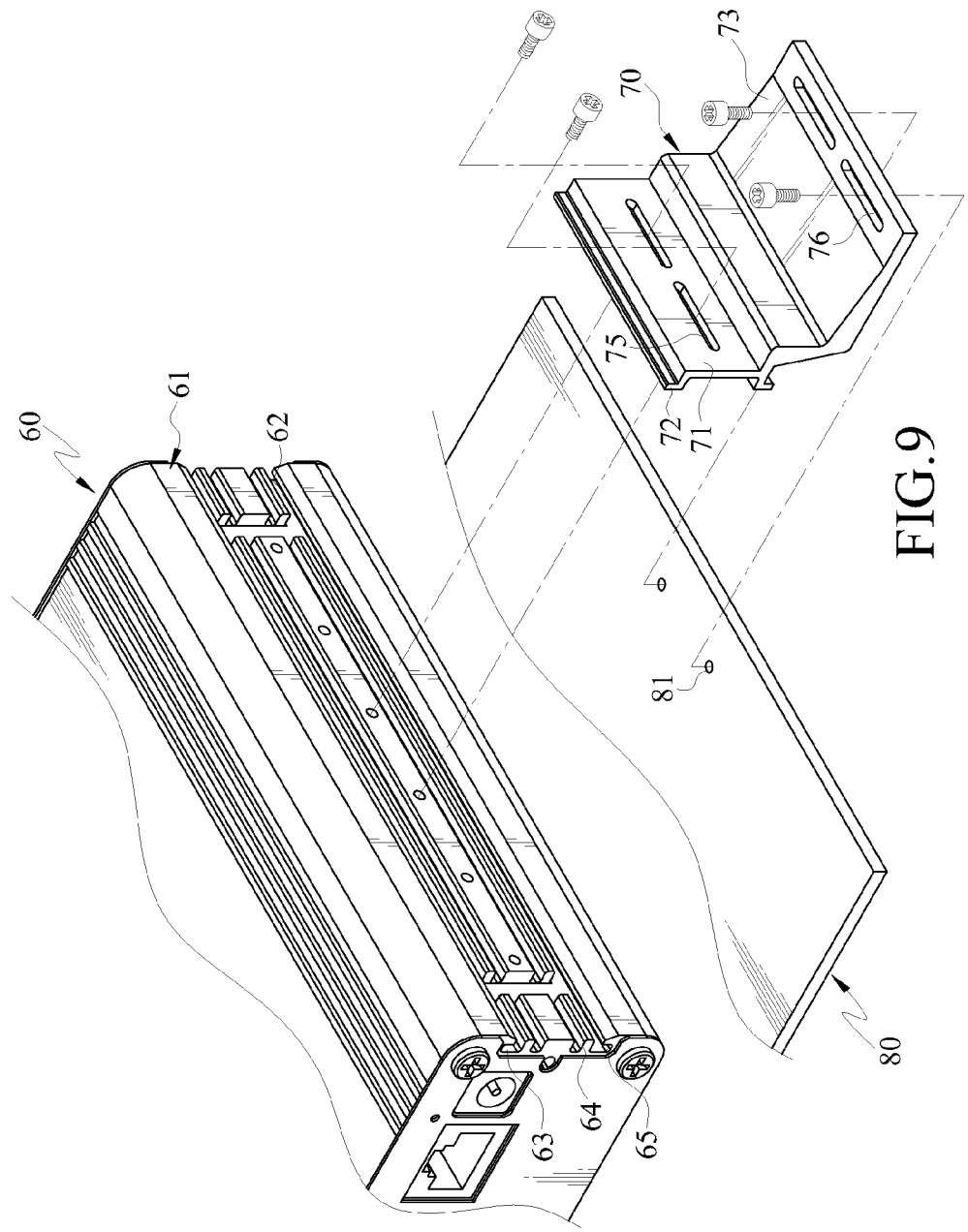
FIG. 9 is an exploded view of a video server set according to an embodiment.
Figure 10:
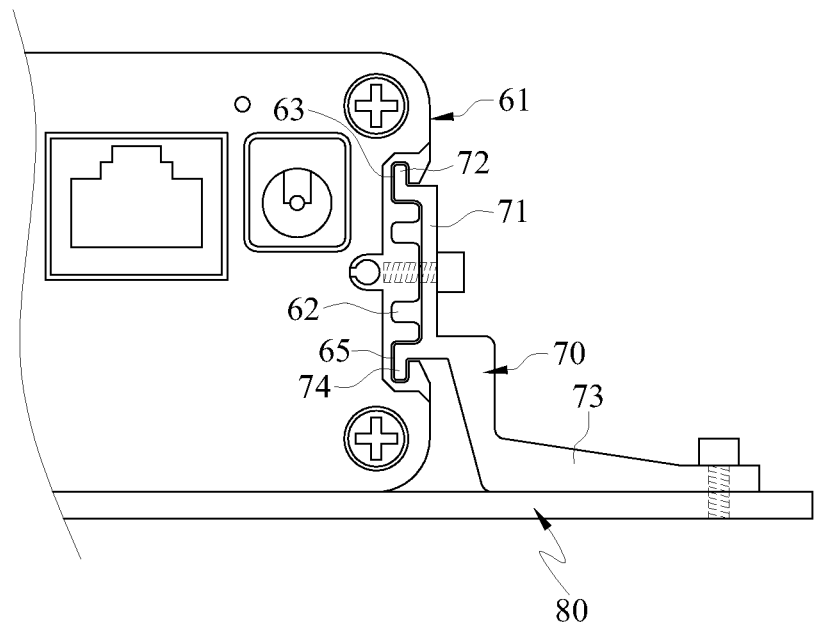
FIG. 10 is a back view of a video server set according to an embodiment.

FIGS. 9 and 10 are an exploded view and a back view of a video server set according to an embodiment respectively.

Similar to the above buckling structure, a fifth surface 61 of the third video server 60 has a third fastening groove 62, and the third fastening groove 62 has a fifth chute portion 63 and a third intermediate portion 64. Besides a main body portion 71 and a fifth hook portion 72, the fixing member 70 further has a support portion 73. The main body portion 71 corresponds to and is accommodated in the third intermediate portion 64, and the fifth hook portion 72 is accommodated in the fifth chute portion 63. The support portion 73 is connected with the main body portion 71, and leans against and is connected with a support plate 80, so that the fixing member 70 is connected with the support plate 80.

The main body portion 71 may be in a plate shape and has two opposite side surfaces, in which one side surface faces the fifth surface 61. The fifth hook portion 72 is configured at a side surface of the main body portion 71 facing the fifth surface 61. The support portion 73 may be in an L shape, a vertical side thereof is connected with the main body portion 71, and a bottom side thereof may be attached to the support plate 80.

It should be noted that, the third video server 60 may be the first video server 20 or the second video server 30 in FIG. 1. The fifth surface 61 of the third video server 60 is hooked with the fixing member 70, and a side surface thereof opposite to the fifth surface 61 may be connected in series with other video servers through the joint member 40.

The third fastening groove 62 of the third video server 60 may further have a sixth chute 65, and the fixing member 70 may further comprise a sixth hook portion 74, so that the fixing member 70 is more stably combined with the third video server 60. The sixth hook portion 74 and the fifth hook portion 72 are configured at two corresponding ends of the same side of the main body portion 71, and the sixth hook portion 74 is accommodated in and is hooked with the sixth chute portion 65.

The main body portion 71 may further comprise a through hole 75 in a long strip shape, so as to lock the fixing member 70 to a locking hole of the fifth surface 61. Similarly, the support portion 73 may also have a through hole 76 in a long strip shape, and the through hole 76 is locked to a locking hole 81 of the support plate 80. Therefore, the fixing member 70 may be locked to the third video server 60 and the support plate 80 of the rack housing simultaneously, so that the entire video server set is fixed on the support plate 80.

Figure 11:
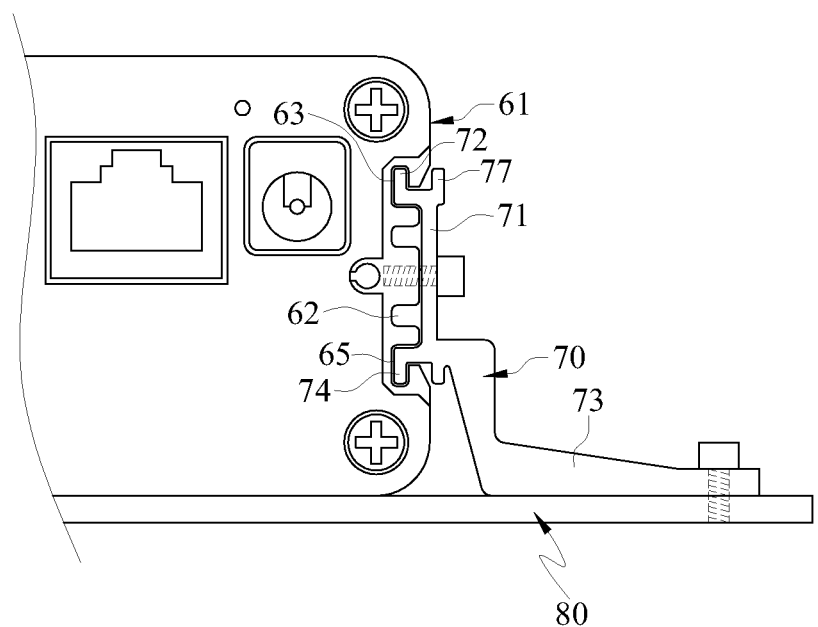
FIG. 11 is a back view of a video server set according to an embodiment.

According to an embodiment, the fifth hook portion 72 or the sixth hook portion 74 may be configured at an end edge of the main body portion 71. However, the fifth hook portion 72 or the sixth hook portion 74 may also be configured at a distance away from the end edge of the main body portion 71, as shown in FIG. 11. Moreover, in the embodiment of FIG. 11, the top end of the main body portion 71 may also have a blocking portion 77. The blocking portion 77 is configured to further ensure that the fifth hook portion 72 may not be disengaged from the fifth chute portion 63.

In view of the above, the plurality of video servers and the joint member in the video server set are connected in series stably and regularly into the rackmount by using the chute portions and the hook portions, and are integrated into the video server set conforming to the specification of the rack housing. Besides, by disposing the chutes and the hooks of the joint member, the video servers can be connected in series through contact, thereby saving the volume occupied by the entire video server set. In addition, the video server set is fixed on the support plate of the rack housing as a whole through the fixing member, which further ensures that the entire video server set may not leave the fixed position where it should be located due to earthquake, external impact or other reasons.

Moreover, the engagement of the chute portion with the hook portion does not require a large number of securing elements as in the prior art, which not only saves the hardware cost, but also greatly simplifies the operating process and time required in the configuration of the video server set. Besides, the contact area of the chute portion and the hook portion is much larger than that of the securing elements in the prior art, so the connection is more stable and reliable.

What is claimed is:

1. A video server set, comprising:
   a first video server, wherein a first surface of the first video server has a first fastening groove, and the first fastening groove has a first chute portion and a first intermediate portion;
   a second video server, wherein the second video server has a second surface opposite to the first surface, the second surface has a second fastening groove, and the second fastening groove has a second chute portion and a second intermediate portion;
   a joint member, having a main body portion, a first hook portion and a second hook portion, wherein the main body portion corresponds to and is accommodated in the first intermediate portion and the second intermediate portion, the first hook portion is accommodated in and is hooked with the first chute portion, and the second hook portion is accommodated in and is hooked with the second chute portion; and
   a baffle plate fixable to the first video server and the second video server,
   wherein the first video server further has a third surface adjacent to the first surface, the first fastening groove has a first port on the third surface, the second video server further has a fourth surface adjacent to the second surface, and the second fastening groove has a second port on the fourth surface; and
   wherein two ends of the baffle plate are connected with a locking portion on the third surface and a locking portion on the fourth surface respectively, and the baffle plate shields a part of the first port of the first fastening groove and the second port of the second fastening groove.

2. The video server set according to claim 1, wherein the main body portion has two opposite side surfaces, and the two side surfaces face the first video server and the second video server respectively; the first hook portion is configured on one of the two side surfaces of the main body portion, and the second hook portion is configured on the other of the two side surfaces of the main body portion.

3. The video server set according to claim 1, wherein the first hook portion and the second hook portion are configured at end edges of the main body portion.

4. The video server set according to claim 1, wherein the first fastening groove further has a third chute portion, and the second fastening groove further has a fourth chute portion, the video server set further comprising:
   a third hook portion, configured at the same side of the main body portion together with the first hook portion, and accommodated in the third chute portion; and
   a fourth hook portion, configured at the same side of the main body portion together with the second hook portion, and accommodated in the fourth chute portion,
   wherein the first hook portion and the second hook portion are configured at one end edge of the two side surfaces, and the third hook portion and the fourth hook portion are configured at the other end edge of the two side surfaces.

5. The video server set according to claim 4, further comprising:
   a third video server, wherein a fifth surface of the third video server has a third fastening groove, and the third fastening groove has a fifth chute portion and a third intermediate portion; and
   a fixing member, having a main body portion, a fifth hook portion and a support portion, wherein the main body portion corresponds to and is accommodated in the third intermediate portion, the fifth hook portion is accommodated in the fifth chute portion, and the support portion is connected with the main body portion, and the support portion leans against and is connected with a support plate, so that the fixing member is connected with the support plate.

6. The video server set according to claim 5, wherein the main body portion has two opposite side surfaces, one of the side surfaces faces the fifth surface, and the fifth hook portion is configured at the side surface of the main body portion facing the fifth surface.

7. The video server set according to claim 5, wherein the fifth hook portion is configured at an end edge of the main body portion.

8. The video server set according to claim 5, wherein the third fastening groove of the third video server further has a sixth chute, the fixing member further comprises a sixth hook portion, the sixth hook portion and the fifth hook portion are configured at two corresponding ends at the same side of the main body portion, and the sixth hook portion is accommodated in the sixth chute portion.

9. The video server set according to claim 8, wherein the sixth hook portion is configured at an end edge of the main body portion.

* * * * *